(12) United States Patent
Walther et al.

(10) Patent No.: US 7,617,774 B2
(45) Date of Patent: Nov. 17, 2009

(54) METHOD FOR PRINTING AN ELECTRONIC CIRCUIT COMPONENT ON A SUBSTRATE USING A PRINTING MACHINE

(75) Inventors: Thomas Walther, Hofheim (DE); Reinhard Baumann, Krailing (DE); Peer Dilling, Friedberg (DE); Robert Weiss, Gersthofen (DE)

(73) Assignee: manroland AG, Offenbach am Main (DE)

( * ) Notice: Subject to any disclaimer, the term of this patent is extended or adjusted under 35 U.S.C. 154(b) by 480 days.

(21) Appl. No.: 11/118,725

(22) Filed: Apr. 29, 2005

(65) Prior Publication Data

US 2005/0241506 A1 Nov. 3, 2005

(30) Foreign Application Priority Data

May 3, 2004 (DE) ................... 10 2004 021 643

(51) Int. Cl.
*B41F 1/12* (2006.01)
(52) U.S. Cl. ................. 101/490; 101/183; 101/217; 101/230; 101/483; 101/492
(58) Field of Classification Search ............... None
See application file for complete search history.

(56) References Cited

U.S. PATENT DOCUMENTS

| | | | |
|---|---|---|---|
| 4,188,883 A * | 2/1980 | Schone et al. ............. 101/183 |
| 4,368,281 A * | 1/1983 | Brummett et al. .......... 523/458 |
| 4,856,426 A | 8/1989 | Wirz |
| 4,930,414 A | 6/1990 | Wirz |
| 5,259,308 A | 11/1993 | Wirz |
| 5,622,652 A * | 4/1997 | Kucherovsky et al. ...... 252/511 |
| 6,147,662 A | 11/2000 | Grabau et al. |
| 6,206,292 B1 * | 3/2001 | Robertz et al. ............ 235/488 |
| 6,823,785 B2 * | 11/2004 | Schneider et al. .......... 101/183 |
| 2004/0103808 A1 | 6/2004 | Lochun |

FOREIGN PATENT DOCUMENTS

| DE | 34 19 762 A1 | 11/1985 |
|---|---|---|
| DE | 37 17 093 A1 | 12/1988 |
| DE | 40 36 253 C1 | 10/1992 |
| DE | 299 14 812 U1 | 10/1999 |

\* cited by examiner

*Primary Examiner*—Jill E Culler
(74) *Attorney, Agent, or Firm*—Leydig, Voit & Mayer, Ltd.

(57) ABSTRACT

A method of printing an electronic circuit or components thereof uses a printing machine to print a conductive structure on the front printing side (back side of the sheet) of a printing substrate. The sheet is then reversed and a decorative printing motif is printed on the back side in one work step. Alternatively, the circuit or components of a circuit may be printed by having a printing machine for color printing preceded by a printing machine for printing on the back side of the printing substrate. A chip is applied to the printing substrate where the back side of the printing sheet with the printing motif is cooled to prevent any negative effect on the printing motif and/or the printing substrate.

7 Claims, 4 Drawing Sheets

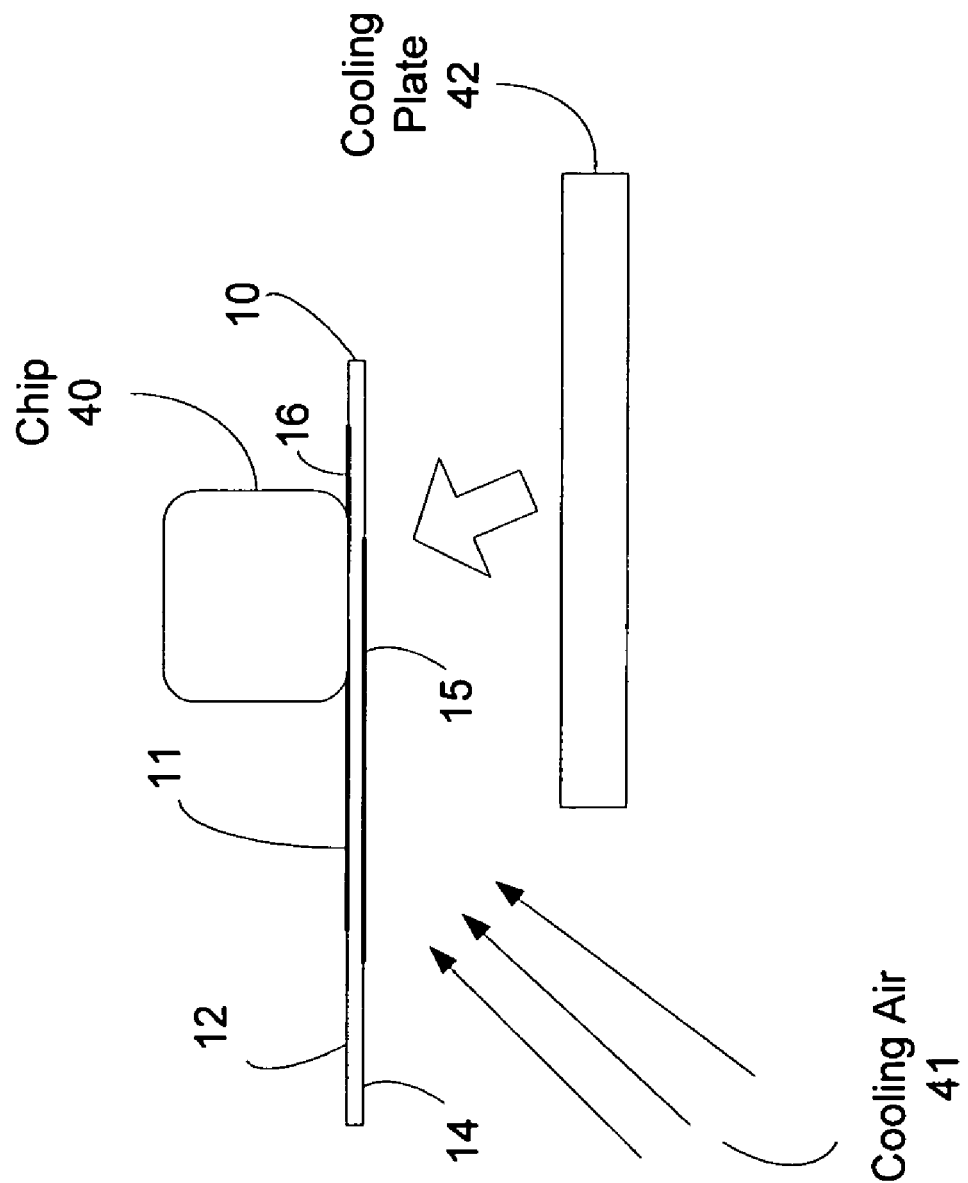

METHOD FOR PRINTING AN ELECTRONIC CIRCUIT COMPONENT ON A SUBSTRATE USING A PRINTING MACHINE

FIELD OF THE INVENTION

The invention relates to methods of forming a printed electronic circuit, and more particularly to printing an electronic circuit component onto a substrate using a printing machine.

BACKGROUND OF THE INVENTION

Conductive materials are often applied to a circuit board substrate using the screen printing technique. A conductive paste, which can contain, for example, silver, aluminum or conductive carbon black, is applied to a substrate to produce a conductor on the substrate. Applications are also known in which similar conductive printing methods are applied to a printing substrate in a lithographic printing method.

One of the possible applications is the so called radio frequency identification (RFID) tags. These RFID tags present the possibility of storing data on a product. The stored data can be used, for example, to control product streams and simplify the management of inventories. Because of the clearly higher data storage capacity compared to the known bar code decoding, RFID tags can conceivably have any number of additional application fields.

A RFID tag consists of an antenna, optionally additional electronic components, and the RFID chip, which is typically applied using the so called bonding method. Today, antennas of the RFID tags can be applied without a problem by offset printing, screen printing or flexoprinting, while the chips needed for the RFID tags are generally glued or soldered to the contact places of the antenna. However, it is conceivable that in the future complete electronic circuits will be printed on a printed product. The antennas can be designed as a coil or a dipole antenna, depending on the frequency band used.

However, the printed antennas can interfere with the desired visual design of the printed package, because of the color hue of the conductive printing inks and its relatively high layer density, which is required to achieve good conductivity of the seams. In addition, the RFID tag which is printed on the exterior of a package can be destroyed or removed easily. An additional problem arises if, in a later processing step, the chip is glued or soldered to the contact place of the antenna. During the adhesive process or soldering process, heat is often generated at the adhesion places, causing discoloration of the printing substrate or, in a worse case, burns on the printing substrate. The discoloration or burns are not desired if only because they interfere with the decorative appearance of the packages.

BRIEF SUMMARY OF THE INVENTION

The present invention relates to a method for printing an electronic circuit or components thereof in a printing machine by the front-side printing and back-side printing method, where the conductive structure is printed on the printed front side of the printing substrate, the sheet is then reversed and the decorative printing motif or pattern is then printed on the back side in a single work step. As an alternative to the front-side and back-side printing method, the printed circuit can be printed by having the printing machines for color printing be preceded by a printing machine for printing on the back side of the printing substrate, so that the latter printing machine is turned from below against the advancing printing sheet. Furthermore, the patent describes a method for the application of a chip to the printing substrate without causing discoloration or damages to the printing substrate or the motif on the other side of the substrate.

The invention will be described in greater detail below with reference to the drawings, of which:

BRIEF SUMMARY OF THE DRAWINGS

FIG. 4 is schematic view of a process of applying an integrated circuit chip to a component printed on a substrate.

DETAILED DESCRIPTION OF THE INVENTION

Figure 1B:
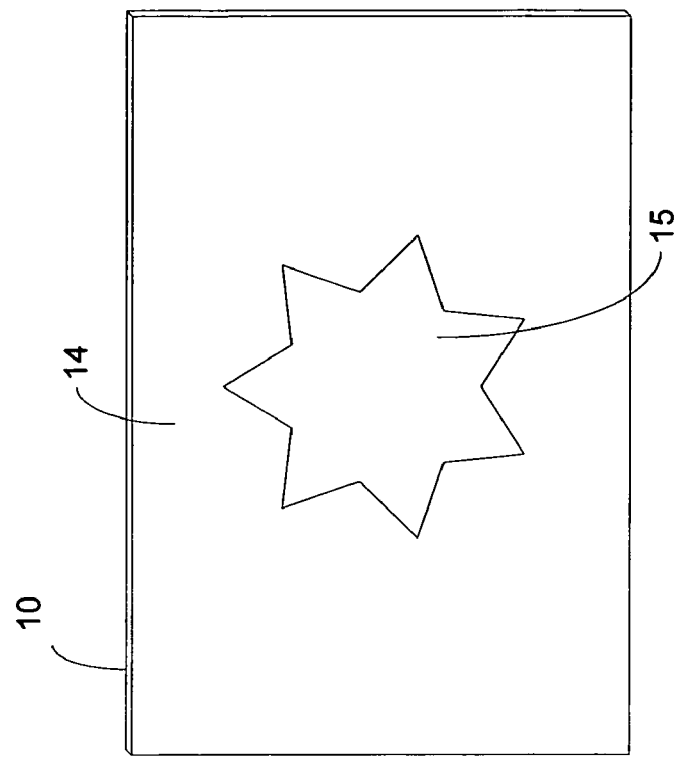
FIGS. 1A and 1B shows in a schematic manner an example of a printed circuit substrate that has a circuit component printed thereon.
Figure 1A:
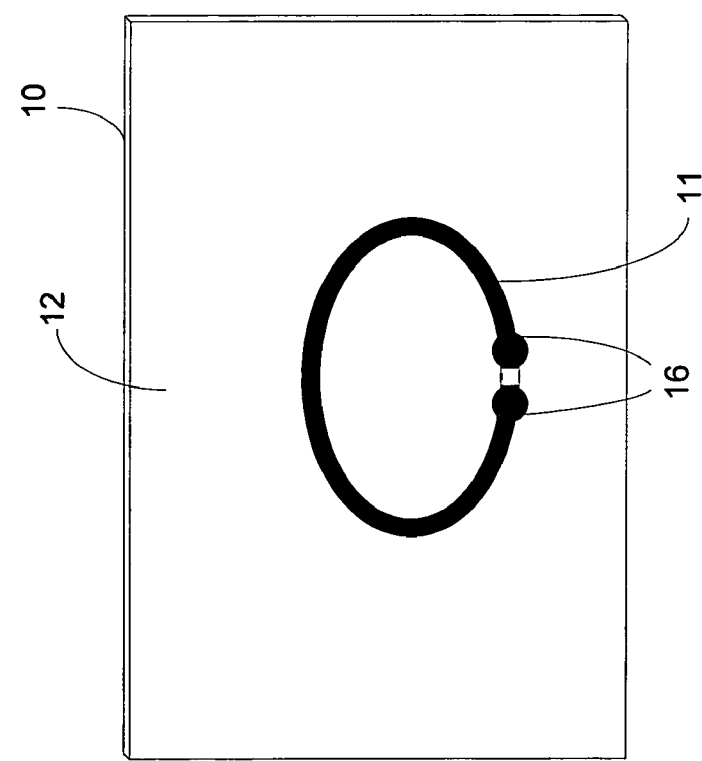

FIGS. 1A and 1B show a highly simplified example of a sheet-like substrate 10 that has a conductive structure printed thereon to form a component 11 of an electronic circuit. The component 11 may be, for example, an coil that serves as the antenna for an RFID circuit. For such an application, the ends of the coil may have contact patches 16 for attaching to a RFID chip. The component 11 is printed on one side, such as the backside 12, of the printed substrate 10, while the opposite side of the substrate, in this example the front side 14, has a design or pattern 15, such as decorative motif, printed thereon.

Figure 2:
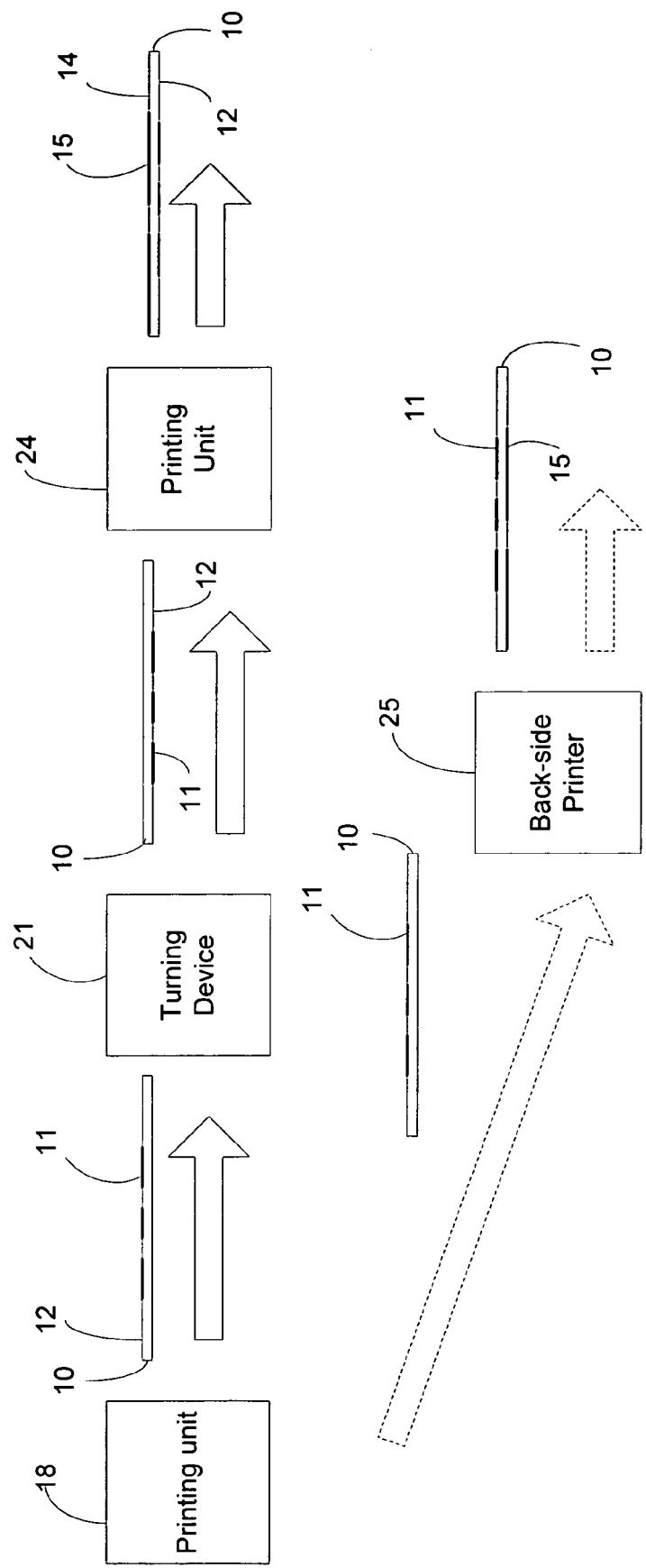
FIG. 2 is a schematic view of a printing process for printing components of a circuit board on a substrate.

According to the invention, the problem of the prior art described earlier is solved by printing parts of the circuit on the inner side of the package (front printing side or back side of the sheet of the printing substrate using the S & W method). As shown in FIG. 2, the circuit part or component 11 is printed using one printing unit 18 of the printing system 20. The sheet 10 is then optionally dried again and reversed using a turnover device 21, and the graphic decorative motif 15 is then printed on the back printing side of the printing substrate 10 by a second printing unit 24.

This method has the advantage that the external appearance is not negatively affected by the applied antennas or by burns produced during the gluing and soldering of the chips. It can be advantageous to apply a preliminary print with a primer or a printing ink before applying the conductive structure, so that the often rougher back side of the printing substrate becomes more covered by the application of a primer/printing ink, and the conductive printing ink does not penetrate excessively into the printing substrate 10.

The application prior to the turnover device 21 can be carried out by one or more flexoprinting machines or by one or more offset printing machines. It is also possible to combine the printing of the conductive structure 10 with the printing of a decorative motif 15.

Figure 3:
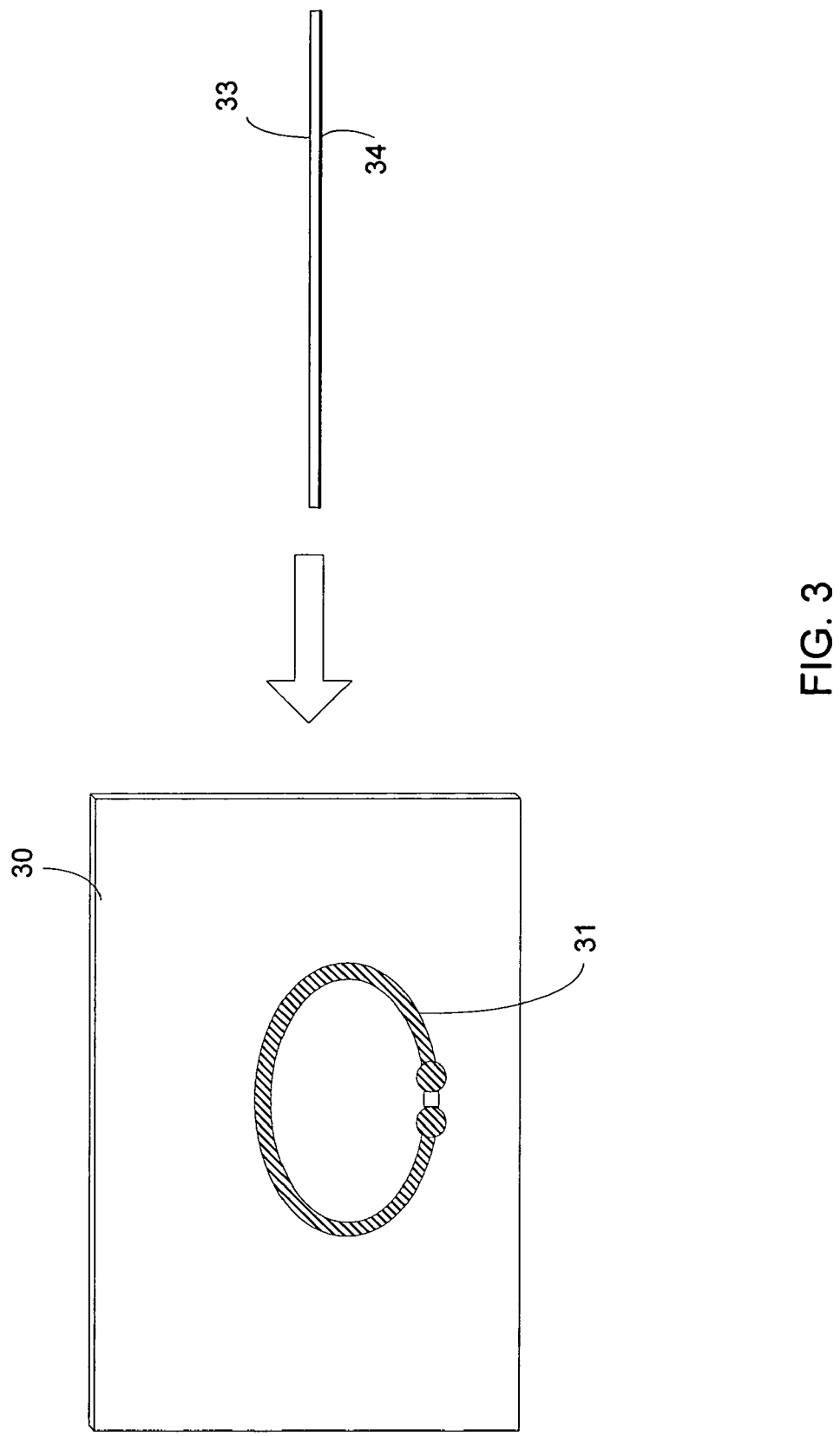
FIG. 3 is a schematic view of an alternative printing process for printing components of a circuit board on a substrate.

As an alternative to direct printing of the conductive printing ink, a film transfer method can be used. Here, as shown in FIG. 3, the motif of the conductive structure is preprinted on the substrate 30 with an adhesive 31. The back side 32 of the printing substrate, which is provided at the places of the motif with adhesive, is then brought into contact with a transfer film 33 in an additional work step, where the transfer layer 34 of the transfer film consists of a conductive material. At the places of the back side of the printing substrate which are provided with adhesive, this conductive transfer layer undergoes a transition to the places which have a motif provided with adhesive. Two different methods can be used for the film transfer. These methods differ in the type of adhesive used. One can use either a physically drying adhesive, or alternatively, an adhesive which hardens under exposure to UV radiation.

Sheet offset printing machines of appropriate design and with several printing machines in a series for the manufacture of colored prints with front-side printing and front-side printing and back-side printing are known from the patents DE 34 19 762 and DE 37 17 093. In DE 40 36 253, a printing machine is disclosed with presents a turnover device following a finishing apparatus. Thus, appropriate turnover devices are already known in multiple designs.

Instead of using a turnover device, the decorative motif may be printed onto the substrate using a back-side printing device. In that case, the turnover device 21 in FIG. 2 is no longer required, and the second printing device 24 is replaced with a back-side printing device 25. So called back-side printing machines are also known, which, arranged below, print on the back side of the sheet without the turnover process. Such a device is disclosed, for example, in DE 29914812. The front-side and back-side printing method and the back-side printing method can be used according to the invention.

An advantage of printing the conductive structures on the backside of the printed substrate is that the conductive structure is smoothened or calendered during the pass through the subsequent printing machines by the back-side printing cylinder. Tests have shown that the conductivity of the conductive structure can be increased considerably by calendering/smoothing. An additional increase in the conductivity could be achieved by slightly heating the back-side printing cylinders which come in contact with the back side of the sheet containing the printed conductive structure. An optimal heat transfer is achieved by pressure and close contact. A temperature increase to >35° [C.] results in a more rapid increase of the conductivity after the printing.

Referring to FIG. 4, an additional challenge relates to the way to fixing a chip 40 by means of bonding/gluing/soldering at the contact points 16 of the antenna 11 or of other conductive structures on the back side 12 of the printing substrate 10. During the process of fixing the chip 40, the heat can pass from the back side 12 of the printing substrate 10 to the front side 14 of the printing substrate, where it can lead to discoloration of the printing decorative image. The discolorations can be prevented if the printed front side of the printing substrates is cooled during the process of fixing the chip 40. The cooling can be achieved by directing cooling air 41 to the printed front surface during the process of fixing the chip, by pressing the printed front side of the printing substrate against a cooled plate 42, or by a cooling process of another type. Such cooling would be considerably more expensive to implement if the conductive structure/antenna is printed on the front side of the sheet together with the decorative printing motif. In that case, burns and discolorations would have to be expected.

The invention claimed is:

1. A method of attaching a chip to a conductive structure printed on a first side of a printing substrate, said printing substrate having a second side with a motif printed thereon, comprising:
    applying cooling to the second side of the printing substrate;
    while cooling is applied to the second side of the printing substrate, attaching the chip to the printed conductive structure on the first side.

2. A method according to claim 1, wherein the step of applying cooling includes pressing the second side with the printed motif against a cooled plate.

3. A method according to claim 1, wherein the step of applying cooling includes exposing the second side to cooling air.

4. A method according to claim 1, wherein the printing substrate is paper.

5. A method according to claim 1, wherein the printing substrate is a film.

6. A method of printing circuit components onto a printing substrate, comprising:
    printing a conductive structure on a first side of the printing substrate, said conductive structure forming a circuit component;
    printing a decorative image motif on a second side of the printing substrate, wherein the printing of the conductive structure and the printing of the decorative image motif are performed in one offset printing process; and
    attaching a chip to the printed conductive structure on the first side of the printing substrate, wherein attaching the chip to the conductive structure further comprises:
    applying cooling means to the second side of the printing substrate; and
    while the cooling means is applied to the second side of the printing substrate, attaching the chip to the printed conductive structure on the first side.

7. A method of printing circuit components onto a printing substrate, comprising:
    printing a conductive structure on a first side of the printing substrate, said conductive structure forming a circuit component;
    printing a decorative image motif on a second side of the printing substrate, wherein the printing of the conductive structure and the printing of the decorative image motif are performed in one offset printing process; and
    attaching a chip to the conductive structure printed on the first side of the printing substrate, wherein attaching the chip to the conductive structure further comprises:
    applying cooling means to the second side of the printing substrate; and
    while the cooling means is applied to the second side of the printing substrate, attaching the chip to the printed conductive structure on the first side.

* * * * *